United States Patent [19]
Anhalt

[11] 4,230,384
[45] Oct. 28, 1980

[54] ELECTRICAL CONTACT

[75] Inventor: John W. Anhalt, Orange, Calif.

[73] Assignee: International Telephone and Telegraph Corporation, New York, N.Y.

[21] Appl. No.: 17,245

[22] Filed: Mar. 5, 1979

[51] Int. Cl.[3] ........................ H05K 1/00; H01R 11/22; H01R 4/10

[52] U.S. Cl. ............................... 339/17 R; 339/252 P; 339/276 R

[58] Field of Search ...................... 339/220, 221, 64 R, 339/17 R, 252 P, 276 R

[56] References Cited

U.S. PATENT DOCUMENTS

| | | | |
|---|---|---|---|
| 2,755,453 | 7/1956 | Cloutier | 85/11 |
| 3,230,493 | 1/1966 | Jensen et al. | 339/220 R |
| 3,348,191 | 10/1967 | Kinkaid | 339/220 R X |
| 3,400,358 | 9/1968 | Bynes et al. | 339/17 R |
| 3,444,504 | 5/1969 | Lynch | 339/64 R |
| 3,634,819 | 1/1972 | Evans | 339/252 P |
| 3,731,261 | 5/1973 | Spadoni | 339/220 R |
| 3,862,792 | 1/1975 | Jayne | 339/221 R X |
| 3,997,237 | 12/1976 | White | 339/221 R X |
| 4,066,326 | 1/1978 | Lovendusky | 339/221 M |

*Primary Examiner*—John McQuade
*Assistant Examiner*—John S. Brown
*Attorney, Agent, or Firm*—Thomas L. Peterson

[57] ABSTRACT

A terminal or the like for insertion into a plated through hole in a printed circuit board. The terminal has a pair of adjacent torsion members which are turned when they are press fit into the printed circuit board hole.

8 Claims, 11 Drawing Figures

ELECTRICAL CONTACT

BACKGROUND OF THE INVENTION

This invention relates to contacts for insertion into plated through holes in a printed circuit board, and more particularly to a terminal of a size to have an interference fit with such a hole.

PRIOR ART STATEMENT

Cloutier U.S. Pat. No. 2,755,453 issued July 17, 1956, discloses a slit 7 in a terminal 1 (FIG. 1) that is deformed as shown in FIG. 4.

Jensen et al. U.S. Pat. No. 3,230,493 issued Jan. 18, 1966, discloses bowed portions *3d'* and *3d''*. See column 3, lines 10–17 and FIG. 3.

Bynes et al. U.S. Pat. No. 3,400,358 issued Sept. 3, 1968, discloses various flexible plug-in contacts 21–26 (FIG. 1), and a contact 37 plugged in (FIG. 6).

Evans U.S. Pat. No. 3,634,819 issued Jan. 11, 1972, discloses an apertured terminal with spring members to engage the interior of a printed circuit board hole. The members have various cross sections. See FIGS. 3A, 4A and 5A. See also FIGS. 1–9.

Lovendusky U.S. Pat. No. 4,066,326 issued Jan. 3, 1978, discloses an expandable terminal or contact. See FIGS. 9–13.

Although resilient press fit contacts are old in the art, the fabrication thereof has been complicated.

An interference fit has also been employed. Such a fit has required the use of considerable axial force to insert a contact into the plated through hole of an epoxy or other printed circuit board.

In the prior art, the printed circuit board could become stressed and could be damaged by contact insertion.

In prior art assemblies there has been unwanted stress on the plated layer. Contact stability has also been lacking.

SUMMARY OF THE INVENTION

In accordance with the contact of the present invention, two torsion members are provided on a connecting part. Manufacturing is made easier. The insertion force is also reduced because a smaller force is required to torque the torsion members. Further, the force reduction lessens the risk of stressing and damaging the plated hole during contact insertion. Stress is also spread more evenly in the plated hole. In addition there is improved contact stability.

BRIEF DESCRIPTION OF THE DRAWINGS

In the accompanying drawings which illustrate an exemplary embodiment of the present invention.

DESCRIPTION OF THE PREFERRED EMBODIMENT

Figure 1:
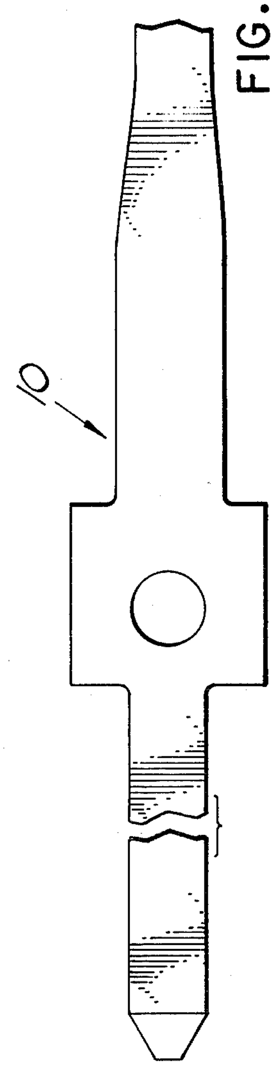
FIG. 1 is a top plan view of a partly fabricated contact constructed in accordance with the present invention.
Figure 2:
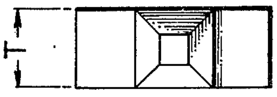
FIG. 2 is an end elevational view of the contact shown in FIG. 1.
Figure 3:
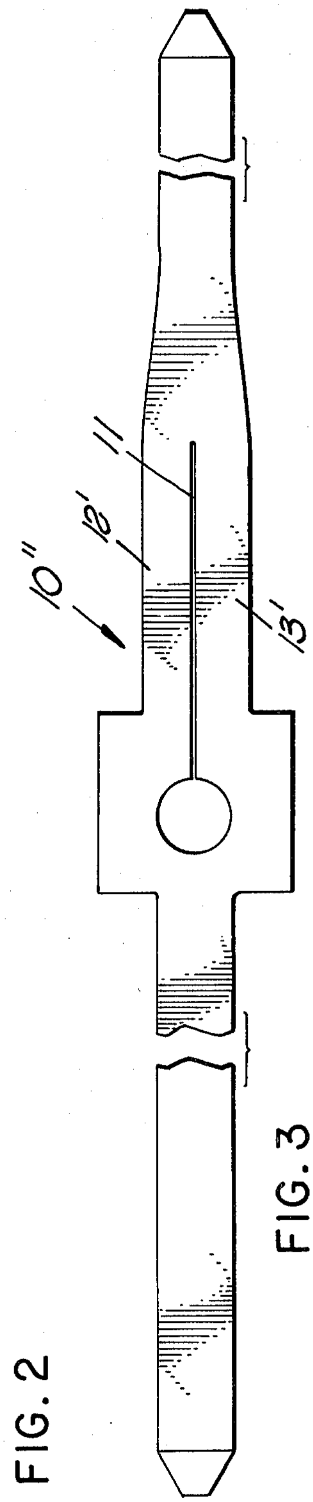
FIG. 3 is a top plan view essentially identical to that shown in FIG. 1 with the addition of a slit therein.

A contact 10' shown in FIG. 1 is slit as contact 10'' is in FIG. 3 at 11. Contact 10' may have a uniform thickness T, (FIG. 2) if desired. In FIG. 3, slit 11 is defined between torsion members 12' and 13' which are subsequently twisted by male and female wedge shaped dies (not shown) to take sets in positions 12 and 13 shown in FIGS. 4–6.

Figure 4:
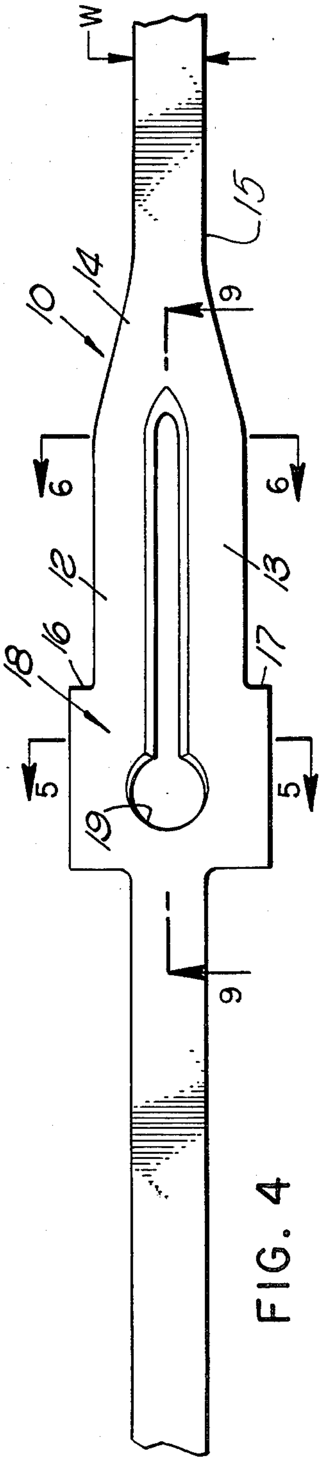
FIG. 4 is a top plan view of a contact completely fabricated in accordance with the present invention.
Figure 5:
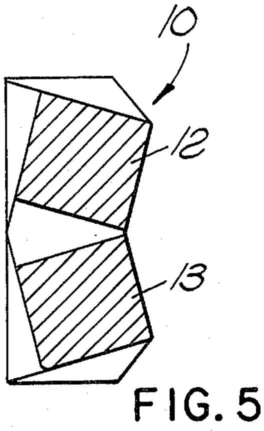
FIG. 5 is a transverse sectional view of the contact taken on the line 5—5 shown in FIG. 4.

A tapered portion 14 of contact 10 in FIG. 4 connects the right ends of torsion members 12 and 13 to a binding post 15 or the like. Binding post 15 may have a width W and thickness T where, for example T≅W.

Contact 10 is inserted in a plated printed circuit board through a hole having a cylindrical internal surface. Preferably the printed circuit board abuts shoulders 16 and 17, portions of or all of torsion members 12 and 13 lying inside and along the length of the through hole or plated portion thereof.

Means 18 having a hole 19 holds the left ends of torsion members 12 and 13 in fixed positions relative to each other.

Figure 6:
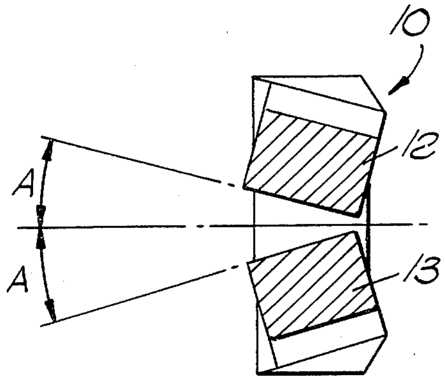
FIG. 6 is a transverse sectional view taken on the line 6—6 shown in FIG. 4.
Figure 7:
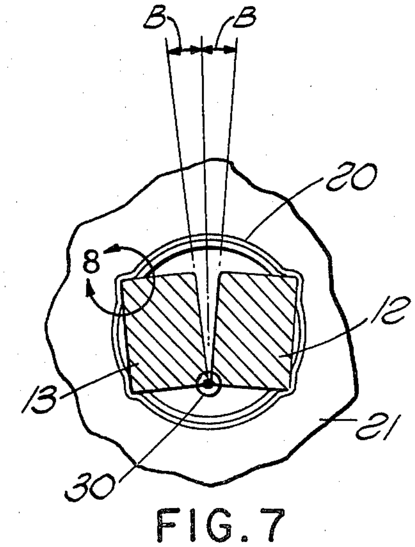
FIG. 7 is a transverse sectional view of the contact inserted inside a printed circuit board through hole.
Figure 8:
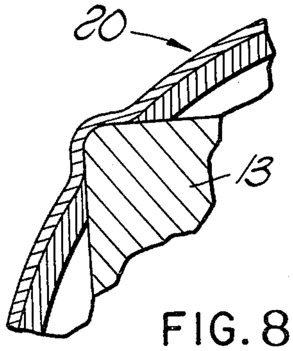
FIG. 8 is an enlarged portion of FIG. 7.
Figure 9:
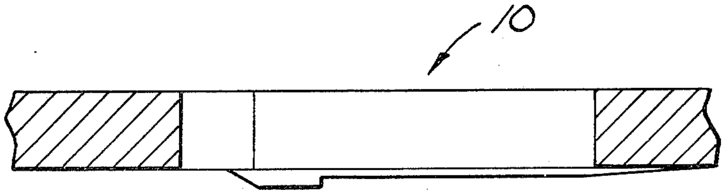
FIG. 9 is a longitudinal sectional view of the contact taken on the line 9—9 shown in FIG. 4.

When, after forming, torsion members 12 and 13 are unstressed, they take the position as shown in FIG. 6 (A≅16 degrees.) They resiliently deform when inserted inside the hole plated as at 20 as shown in FIGS. 7 and 8 (B≅7½ degrees). Plating layer 20 is shown with circuit board 21.

Contact 10 is inserted through printed circuit board 21 and layer 20 by first inserting binding post 15 therethrough.

As shown in FIG. 8, layer 20 is a copper and a tin-lead (solder) laminate.

Tapered portion 14 guides torsion members 12 and 13 inside layer 20.

The resilient press fit contact 10 described herein has a compliant press fit section (12, 13) which directly interfaces or contacts layer 20 in printed circuit board 21. Board 21 may be made of an epoxy, if desired. Contact can be simplified over that of prior art contacts.

Basic fabrication operations require slitting, blanking and angular off-setting. The resulting contact is somewhat wedge shaped and includes the two independently functioning torsion members or beams 12 and 13. During contact insertion into the plated through hole the wedge shaped section comes into contact with the hole inside diameter due to a dimensional interference. Initial action of the contact 10 is that of closing the gap between the wedge shaped torsion beams 12 and 13. The point at which the beams touch becomes a fulcrum or base point for further beam deflection. As the contact is inserted further into the hole the wedge shaped torsion beams pivot around this base point and rotate towards each other. This rotational action imparts a side wipe between contact beam and hole inside diameter. Solder, because of low compressive strength, is displaced allowing the contact a direct interface with copper underplating and subsequent deformation of the copper and the epoxy printed circuit board.

Prior art contacts wipe in the plated through hole. The contact of the present invention reduces substantially the solder so loosened and pushed through. Most prior art press fit systems, resilient or non-resilient, push thin sleeves of solder ahead of the terminal and out the reverse side of the printed circuit board. This is referred to as "icicling" and is not desirable due to potential circuitry shorting. The contact of the present invention does not do this.

Due to four lines of contact in the hole, the contact 10 is very stable. Further self centering of the contact 10 in the hole is achieved.

Ease of manufacturing, low insertion forces, minimum stress to the printed circuit board, contact stability and independent beam action make the use of contact 10 advantageous.

Torsion beams 12 and 13 operate (rotate) essentially independently of each other even where they may touch at a pivot point or line 30 in FIG. 7. This is advantageous over the prior art compliant pin shown in FIGS. 10 and 11.

Figure 10:
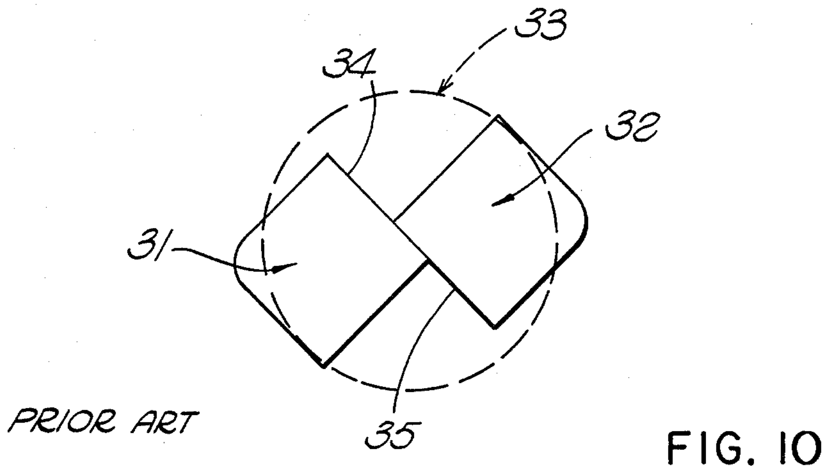
FIGS. 10 and 11 are prior art diagrams.
Figure 11:
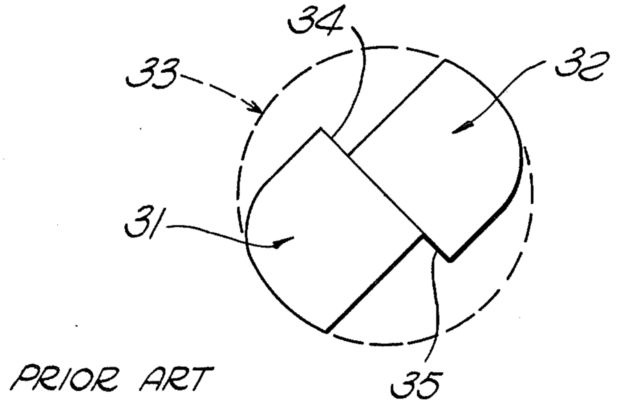

In FIG. 10, members 31 and 32 have not been inserted into hole 33. In FIG. 11 they have. On the insertion, note surfaces 34 and 35 bear against each other at a high friction point and move intermittently causing a random spring rate.

The rotation of torsion beams 12 and 13 (FIGS. 6 and 7) thus overcomes the high friction and random spring rate problems of the members 31 and 32 in FIGS. 10 and 11. This is true because torsion beams 12 and 13 do not have sliding surfaces such as surfaces 34 and 35 in FIGS. 10 and 11.

What is claimed is:

1. A printed circuit board assembly comprising:

a printed circuit board having a through hole internally plated with an electrically conductive material;

a terminal press fit into said hole, said terminal including a binding post or the like, a resilient support and a connecting part therebetween;

said resilient support being located in said hole and consisting of a pair of longitudinal torsion members arranged in wedge-like orientation in transverse cross-section;

said connecting part having one end fixed relative to each of an adjacent pair of ends of said torsion members and another end fixed relative to said binding post, said connecting part being tapered from a larger cross section at said one end to a smaller cross section at said other end to permit said support to be press fit into said hole;

said torsion members having facing surfaces and surfaces not facing, each of said surfaces not facing including an outer longitudinal edge engaging the conductive material on the interior of said hole;

said facing surfaces having inner longitudinal edges engaging with each other at a fulcrum point and inner longitudinal edges spaced from each other; and said torsion members rotating toward each other around said fulcrum point when said support is press fit into said hole whereby a side wiping action occurs between said outer longitudinal edges and the conductive material on the interior of said hole.

2. The invention as defined in claim 1, wherein said torsion members each have an approximately rectangular cross section approximately uniform along the lengths thereof, said facing surfaces rotating toward each other when said support is press fit in said hole.

3. The invention as defined in claim 1, wherein means are provided to hold the other adjacent ends of said torsion members in fixed positions relative to each other.

4. The invention as defined in claim 1, wherein said torsion members are rotatable substantially independent of each other.

5. A terminal adapted to be mounted in a plated through hole in a printed circuit board comprising:

a binding post or the like;

a resilient support adapted to be press fit into said hole, said support consisting of a pair of approximately parallel longitudinal torsion members arranged in wedge-like orientation in transverse cross-section;

first and second connecting parts, said first part having one end fixed relative to one adjacent pair of ends of said torsion members and another end fixed relative to said binding post, said second connecting part holding the other ends of said torsion members in fixed positions relative to each other;

said first connecting part being tapered from a larger cross section at said one end to a smaller cross section at said other end;

said torsion members having facing surfaces bounded by two pairs of inner longitudinal edges, and surfaces not facing;

each of said surfaces not facing including an outer longitudinal edge adapted to engage the wall of the plated through hole; and two of said inner longitudinal edges on said respective facing surfaces being spaced apart more closely than the other two inner edges thereon, said closely spaced inner edges being sufficiently close to each other so that when said support is press fit into said hole said inner edges will engage each other at a fulcrum point so that said torsion members will rotate toward each other around said fulcrum point.

6. The invention as defined in claim 1, wherein each of said surfaces not facing includes a pair of said outer longitudinal edges each engaging the conductive material on the interior of said hole.

7. The invention as defined in claim 5, wherein each of said surfaces not facing includes a pair of said outer longitudinal edges each located for engaging the wall of the plated through hole.

8. The invention as defined in claim 5, wherein said torsion members each have an approximately rectangular cross-section uniform along the lengths thereof, said facing surfaces rotating toward each other when said support is press fit into the hole.

* * * * *